United States Patent
Misaki

(10) Patent No.: US 7,727,822 B2
(45) Date of Patent: Jun. 1, 2010

(54) ACTIVE MATRIX SUBSTRATE AND LIQUID CRYSTAL DISPLAY DEVICE, PRODUCTION METHODS THEREOF AND ELECTRONIC DEVICE

(75) Inventor: Katsunori Misaki, Yonago (JP)

(73) Assignee: Sharp Kabushiki Kaisha, Osaka (JP)

(*) Notice: Subject to any disclaimer, the term of this patent is extended or adjusted under 35 U.S.C. 154(b) by 249 days.

(21) Appl. No.: 11/366,630

(22) Filed: Mar. 2, 2006

(65) Prior Publication Data

US 2006/0237720 A1    Oct. 26, 2006

(30) Foreign Application Priority Data

Mar. 3, 2005    (JP)    ............... 2005-058886

(51) Int. Cl.
*H01L 21/00*    (2006.01)
(52) U.S. Cl. ............... 438/149; 257/59; 349/39; 349/41; 349/42; 349/43; 349/46
(58) Field of Classification Search ............... 438/149; 349/39, 41, 42, 43, 46; 257/59
See application file for complete search history.

(56) References Cited

U.S. PATENT DOCUMENTS

| | | | | |
|---|---|---|---|---|
| 5,327,001 | A | * | 7/1994 | Wakai et al. ............... 257/350 |
| 5,757,028 | A | * | 5/1998 | Sasaki et al. ............... 257/57 |
| 5,930,607 | A | | 7/1999 | Satou |
| 5,978,058 | A | * | 11/1999 | Sung ............... 349/139 |
| 6,087,730 | A | | 7/2000 | McGarvey et al. |
| 6,323,051 | B1 | * | 11/2001 | Shimada ............... 438/30 |
| 6,335,290 | B1 | | 1/2002 | Ishida |
| 6,410,411 | B1 | | 6/2002 | McGarvey et al. |
| 6,451,632 | B1 | * | 9/2002 | Sung ............... 438/149 |
| 6,534,789 | B2 | | 3/2003 | Ishida |
| RE38,292 | E | | 10/2003 | Satou |

(Continued)

FOREIGN PATENT DOCUMENTS

JP    01-259565 A    10/1989

(Continued)

OTHER PUBLICATIONS

Statement of relevance for Japanese Unexamined Patent Publication No. 2000-332254, published Nov. 30, 2000.

*Primary Examiner*—David Vu
*Assistant Examiner*—Brandon Fox
(74) *Attorney, Agent, or Firm*—Keating & Bennett, LLP

(57) ABSTRACT

A layer stack including an operating semiconductor layer and a low resistance semiconductor layer is patterned by using a first mask pattern so as to have an insular shape and then a circumferential sidewall of the layer stack whose top surface is covered by the first mask pattern is oxidized under a condition that at least ends of the first mask pattern which ends contacts the low resistance semiconductor layer are not positioned behind ends of the layer stack which ends contacts the first mask pattern, thereby forming a sidewall oxidized film only on the circumferential sidewall of the layer stack. After the first mask pattern is removed, an electrode/wiring layer is formed on the layer stack by using a second mask pattern, the electrode/wiring layer being electrically connected with the low resistance semiconductor layer and having the same shape as the low resistance semiconductor layer at a region where the insular operating semiconductor layer is formed.

17 Claims, 7 Drawing Sheets

U.S. PATENT DOCUMENTS

| | | | |
|---|---|---|---|
| 6,709,901 B1 * | 3/2004 | Yamazaki et al. | 438/149 |
| 6,900,464 B2 | 5/2005 | Doi et al. | |
| 6,956,626 B2 * | 10/2005 | Tseng | 349/40 |
| 2001/0019127 A1 | 9/2001 | Ishida | |
| 2001/0041392 A1 * | 11/2001 | Suzawa et al. | 438/149 |
| 2003/0032267 A1 | 2/2003 | Hamatani et al. | |
| 2003/0124778 A1 | 7/2003 | Doi et al. | |
| 2003/0207506 A1 | 11/2003 | Satou | |
| 2004/0089878 A1 * | 5/2004 | Takehashi et al. | 257/200 |
| 2005/0012151 A1 * | 1/2005 | Yamaguchi et al. | 257/347 |
| 2005/0082541 A1 | 4/2005 | Satou | |
| 2005/0084999 A1 | 4/2005 | Satou | |
| 2005/0104071 A1 | 5/2005 | Satou | |
| 2005/0161673 A1 | 7/2005 | Doi et al. | |
| 2005/0233509 A1 | 10/2005 | Satou | |
| 2006/0003596 A1 * | 1/2006 | Fucsko et al. | 438/758 |

FOREIGN PATENT DOCUMENTS

| | | |
|---|---|---|
| JP | 02-043739 A | 2/1990 |
| JP | 06-314698 A | 11/1994 |
| JP | 08-107212 A | 4/1996 |
| JP | 10-256155 A | 9/1998 |
| JP | 2000-501569 | 2/2000 |
| JP | 2000-332254 | 11/2000 |
| JP | 2003-045801 A | 2/2003 |
| JP | 2003-188183 | 7/2003 |
| JP | 2004-165688 | 6/2004 |
| JP | 2005-039026 A | 2/2005 |
| WO | 97/13177 A1 | 4/1997 |
| WO | WO 98/12754 | 3/1998 |

* cited by examiner

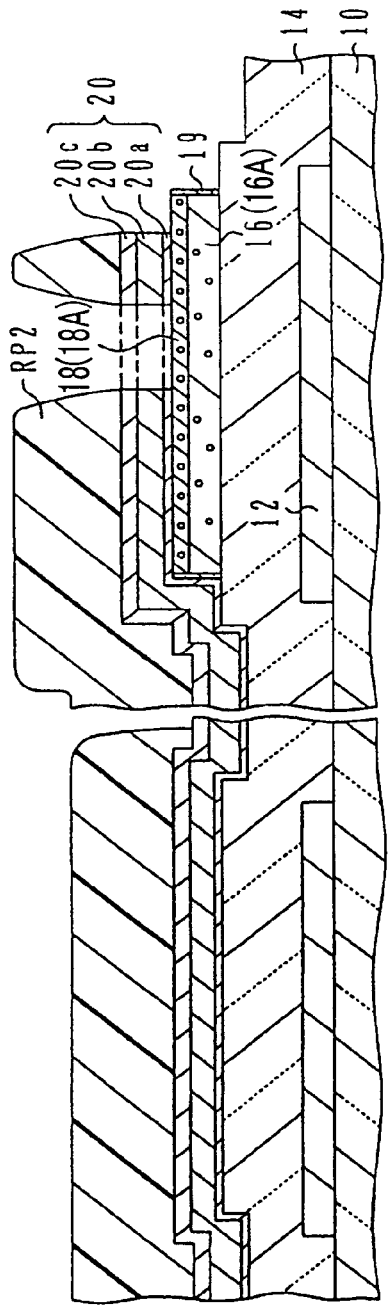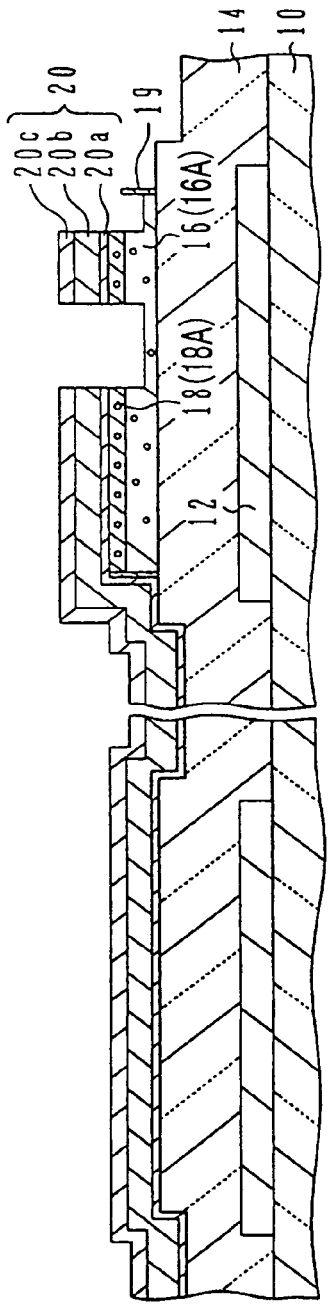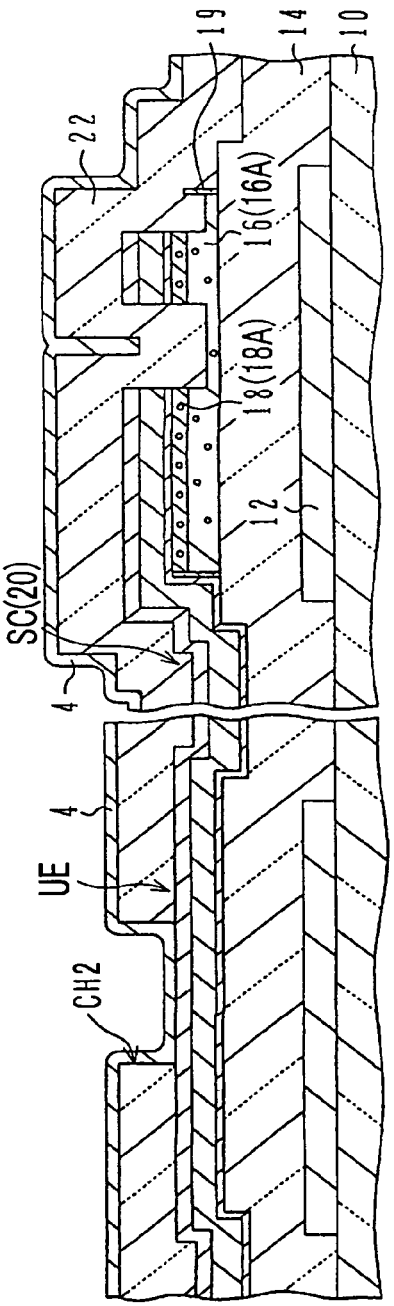
FIG. 3 (D)
FIG. 3 (E)
FIG. 3 (F)

ACTIVE MATRIX SUBSTRATE AND LIQUID CRYSTAL DISPLAY DEVICE, PRODUCTION METHODS THEREOF AND ELECTRONIC DEVICE

This non-provisional application claims priority under 35 U.S.C. §119(a) on Patent Application No. 2005-058886 filed in Japan on Mar. 3, 2005, the entire contents of which are hereby incorporated by reference.

FIELD OF THE INVENTION

The present invention relates to (i) an active matrix substrate and a liquid crystal display device, (ii) methods for producing the active matrix substrate and the liquid crystal display device, and (iii) an electronic device including the active matrix substrate.

BACKGROUND OF THE INVENTION

In a liquid crystal display device which displays images by arraying multiple pixels in a matrix manner, when the number of pixels is large and a duty ratio is low, an active matrix substrate in which a switching element such as a thin film transistor (TFT) is formed so as to correspond to each pixel is often used (for example, see Japanese Unexamined Patent Publication No. 0501569/2000 (Tokuhyo 2000-501569) (Document 1; published on Feb. 8, 2000, corresponding to the pamphlet of International Publication WO 98/12754, corresponding U.S. Pat. No. 6,087,730, corresponding U.S. Pat. No. 6,410,411), Japanese Unexamined Patent Publication No. 332254/2000 (Tokukai 2000-332254) (Document 2; published on Nov. 30, 2000), Japanese Unexamined Patent Publication No. 188183/2003 (Tokukai 2003-188183) (Document 3; published on Jul. 4, 2003, corresponding U.S. Patent Publication No. 2003/0124778, corresponding U.S. Pat. No. 6,900,464), Japanese Unexamined Patent Publication No. 165688/2004 (Tokukai 2004-165688) (Document 4; published on Jun. 10, 2004, corresponding U.S. Patent Publication No. 2001/0019127, corresponding U.S. Pat. No. 6,335,290, corresponding U.S. Pat. No. 6,534,789)).

A signal voltage is supplied to a pixel electrode via a switching element such as a TFT. In order to enhance retention of the signal voltage, an auxiliary capacitor is formed. For example, an auxiliary capacitor bus line is formed so as to be parallel to a gate bus line so that a capacitance is prepared between the pixel electrode and the auxiliary capacitor bus line.

When an off resistance of the switching element such as the TFT is infinite and there is no leakage in the auxiliary capacitor, a signal voltage having been temporarily stored in the auxiliary capacitor is retained until the signal voltage is rewritten. On the other hand, for example, when there is a leakage current in the TFT, the retained signal voltage gradually decreases. When there is a smaller leakage in the TFT, better image quality is realized.

SUMMARY OF THE INVENTION

An object of the present invention is to provide (i) an active matrix substrate and a liquid crystal display device in which leakage in a switching element such as a TFT is small and a process margin is large, (ii) methods for producing the active matrix substrate and the liquid crystal display device, and (iii) an electronic device including the active matrix substrate.

In order to achieve the object, a method according to the present invention for producing an active matrix substrate includes the steps of: (a) forming, above an insulating substrate, a layer stack which includes an operating semiconductor layer and a low resistance semiconductor layer; (b) forming a first mask pattern having an insular shape on the layer stack; (c) patterning the layer stack so that the layer stack becomes insular by using the first mask pattern as an etching mask; (d) oxidizing a circumferential sidewall of the layer stack whose top surface is covered by the first mask pattern, under a condition that at least an end of the first mask pattern which end contacts the low resistance semiconductor layer is not positioned more inward than an end of the layer stack which end contacts the first mask pattern so as to form a sidewall oxidized film only on the circumferential sidewall of the layer stack; (e) removing the first mask pattern so as to form an insular layer stack in which the sidewall oxidized film is formed only on the circumferential sidewall of the layer stack; (f) forming an electrode/wiring layer on the layer stack so as to cover the layer stack; (g) forming a second mask pattern having a wiring shape on the electrode/wiring layer; (h) patterning the electrode/wiring layer by using the second mask pattern as an etching mask; (i) patterning a whole thickness of the low resistance semiconductor layer and a partial thickness of the operating semiconductor layer by using the second mask pattern as an etching mask so that the electrode/wiring layer in a region where the insular operating semiconductor layer is formed has the same shape as the low resistance semiconductor layer; and (j) removing the second mask pattern so as to leave the low resistance semiconductor layer which has been divided on the operating semiconductor layer and the electrode/wring layer which has been electrically connected with the low resistance semiconductor layer.

Further, an active matrix substrate according to the present invention is an active matrix substrate produced through the method according to the present invention for producing an active matrix substrate, wherein the low resistance semiconductor layer, which has the same shape as the electrode/wiring layer in the region where the insular operating semiconductor layer is formed, is laminated on the insular operating semiconductor layer, the sidewall oxidized film is formed on (I) a circumferential sidewall of the operating semiconductor layer and (II) a portion of a circumferential sidewall of the low resistance semiconductor layer, said portion being positioned below a portion where the electrode/wiring layer is drawn out of a region where the operating semiconductor layer is formed, and the sidewall oxidized film on the circumferential sidewall of the operating semiconductor layer, which sidewall oxidized film being on a portion other than the portion below the portion where the electrode/wiring layer is drawn in the layer stack, stands so as to have a fence-like shape, the sidewall oxidized film having the fence-like shape being positioned so as to have an interval from the low resistance semiconductor layer.

Further, a liquid crystal display device according to the present invention includes the active matrix substrate according to the present invention.

Further, in order to achieve the object, a method according to the present invention for producing a liquid crystal display device includes the step of combining an active matrix substrate produced through the method according to the present invention for producing an active matrix substrate with a counter substrate so that the active matrix substrate and the counter substrate have a liquid crystal layer therebetween.

Further, in order to achieve the object, a method according to the present invention for producing a liquid crystal display device includes the steps of: (a) forming, above an insulating transparent substrate, a layer stack which includes an operating semiconductor layer and a low resistance semiconductor layer for a contact; (b) forming a first mask pattern having an insular shape on the layer stack; (c) patterning the layer stack so that the layer stack becomes insular by using the first mask pattern as an etching mask; (d) oxidizing a circumferential sidewall of the layer stack, which sidewall is exposed at the first mask pattern, so as to form a sidewall-oxidized film without allowing the first mask pattern to be positioned behind the sidewall oxidized film; and (e) removing the first mask pattern so as to expose an insular layer stack in which the sidewall oxidized film is formed only on the circumferential sidewall.

With each of the methods, because the sidewall is oxidized without allowing the mask pattern to be positioned behind the sidewall oxidized film, the oxidized film is not formed on the top surface of the layer stack and accordingly it is easy to remove the low resistance semiconductor layer. As such, a margin of a process for leaving the operating semiconductor layer increases. Therefore, with the present invention, it is possible to provide (i) an active matrix substrate and a liquid crystal display device in which leakage in a switching element such as a TFT is small and a process margin is large, (ii) methods for producing the active matrix substrate and the liquid crystal display device, and (iii) an electronic device including the active matrix substrate.

For a fuller understanding of the nature and advantages of the invention, reference should be made to the ensuing detailed description taken in conjunction with the accompanying drawings.

BRIEF DESCRIPTION OF THE DRAWINGS

FIG. 4(B) illustrates a cross sectional view taken in IVB-IVB of the TFT illustrated in FIG. 4(A), thereby schematically illustrating a structure of a TFT in studies carried out in the present invention.

FIG. 4(C) illustrates a cross sectional view taken in IVC-IVC of the TFT illustrated in FIG. 4(A), thereby schematically illustrating the structure of the TFT illustrated in FIG. 4(B).

FIG. 5(A) illustrates a cross sectional view taken in IVC-IVC of the TFT illustrated in FIG. 4(A), thereby schematically illustrating a structure of another TFT in the studies carried out in the present invention.

DESCRIPTION OF THE EMBODIMENTS

With reference to FIGS. 1(A) through 6, the following explains how to produce a liquid crystal display device according to an embodiment of the present invention.

FIG. 1(A) is an oblique perspective view schematically illustrating a structure of the liquid crystal display device according to the embodiment of the present invention.

As illustrated in FIG. 1(A), the liquid crystal display device according to the present embodiment has an arrangement in which a TFT substrate 1 (active matrix substrate) faces a counter substrate 3 so as to have a liquid crystal layer (not shown) between the TFT substrate 1 and the counter substrate 3. Polarizing plates P1 and P2, which constitute a pair, are disposed outside the TFT substrate 1 and the counter substrate 3. A backlight unit BL is disposed at a back side of the polarizing plate P2 (namely, a side opposite to a display side of the liquid crystal display device). The liquid crystal display device further includes a control circuit CTR, a horizontal driver DRH, and a vertical driver DRV. By transmitting a control signal from the control circuit CTR to the horizontal driver DRH and the vertical driver DRV, the liquid crystal display device is controlled so as to be driven.

FIG. 1(B) is a plan view schematically illustrating a structure of the TFT substrate 1 in the liquid crystal display device illustrated in FIG. 1(A). As illustrated in FIG. 1(B), a plurality of gate bus lines 6 are disposed on the surface of the TFT substrate 1 in a lateral direction so as to be parallel to one another, and a plurality of drain bus lines 8 are disposed on the surface of the TFT substrate 1 in a vertical direction so as to be parallel to one another. The gate bus lines 6 and the drain bus lines 8 cross vertically. A region surrounded by the gate bus lines 6 neighboring each other and the drain bus lines 8 neighboring each other is a region of a pixel (a pixel region). A TFT (thin film transistor) 2 is connected with each junction of the gate bus lines 6 and the drain bus lines 8. One of current terminals of the TFT 2 is connected with a pixel electrode 4. An auxiliary capacitor bus line 7 is disposed in parallel to each gate bus line 6 so as to overlap with the pixel electrode 4. On the counter substrate 3, a color filter layer (not shown) and a common electrode (not shown) are formed for example. The following further explains the TFT substrate 1.

FIG. 2(A) is a plan view schematically illustrating a subject part of the TFT substrate 1 illustrated in FIGS. 1(A) and 1(B). To be specific, FIG. 2(A) schematically illustrates a pixel region and vicinity thereof of the TFT substrate 1. FIG. 2(B) is a cross sectional view taken in IIB-IIB of the TFT substrate 1 illustrated in FIG. 2(A).

Figure 1:
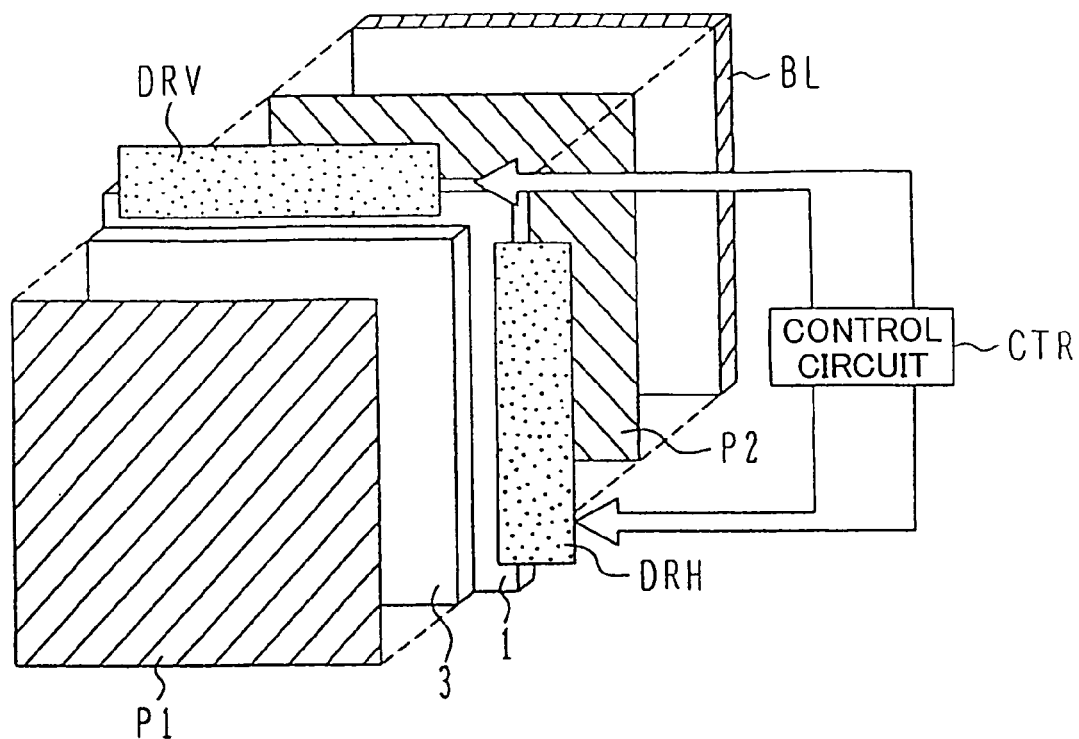
FIG. 1(A) is an oblique perspective view schematically illustrating a structure of a liquid crystal display device according to an embodiment of the present invention.
FIG. 1(B) is a plan view schematically illustrating a structure of a TFT substrate of the liquid crystal display device illustrated in FIG. 1(A).
Figure 1:
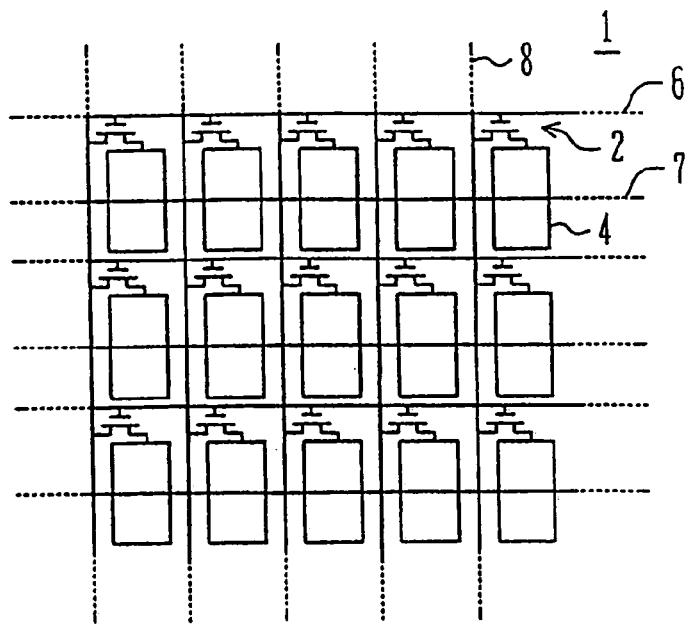
Figure 2:
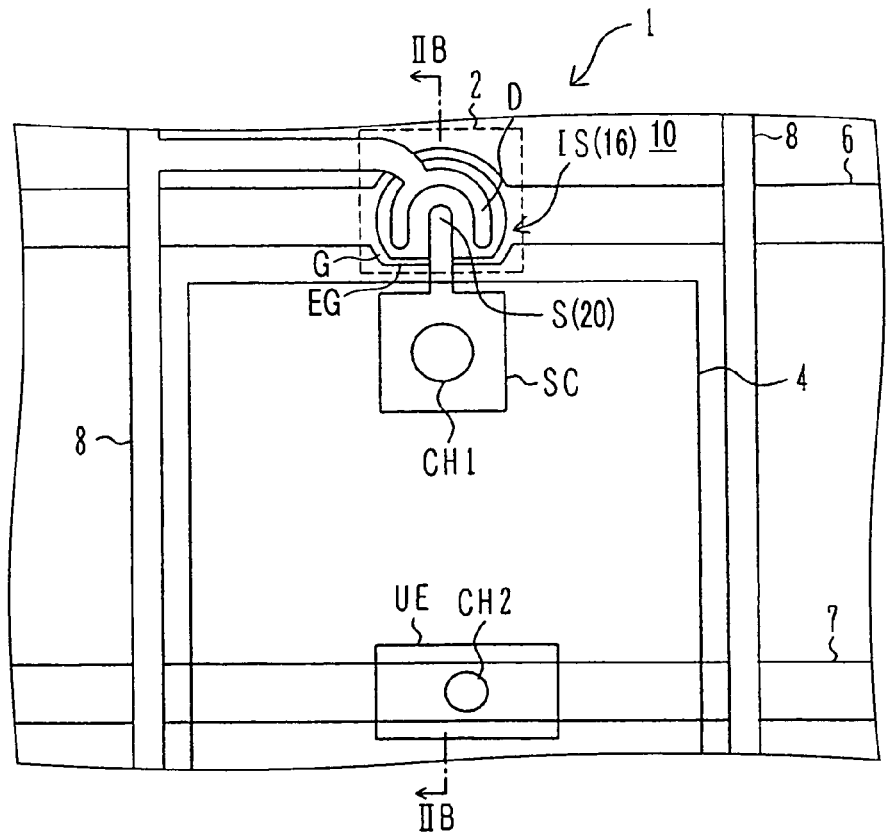
FIG. 2(A) is a plan view schematically illustrating a subject part of the TFT substrate illustrated in FIGS. 1(A) and 1(B).
FIG. 2(B) is a cross sectional view taken in IIB-IIB of the TFT substrate illustrated in FIG. 2(A).
Figure 2:
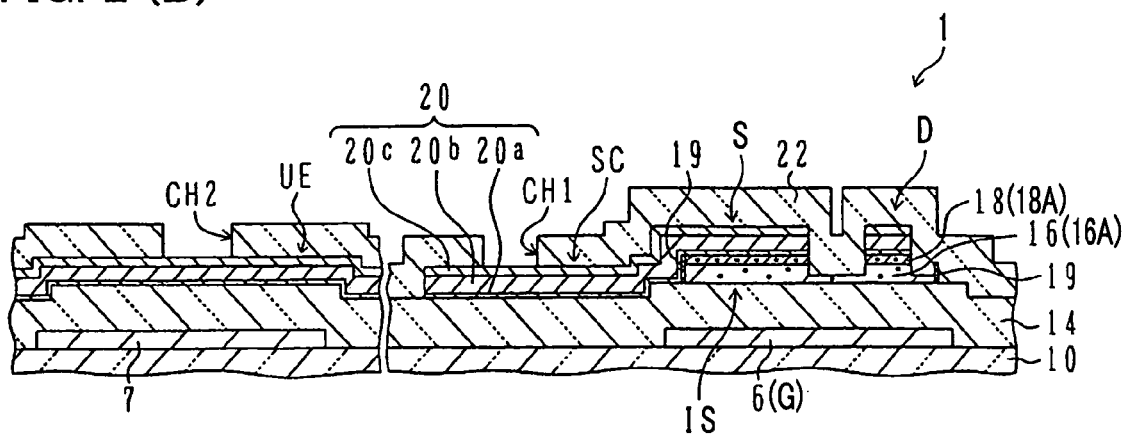
Figure 3:
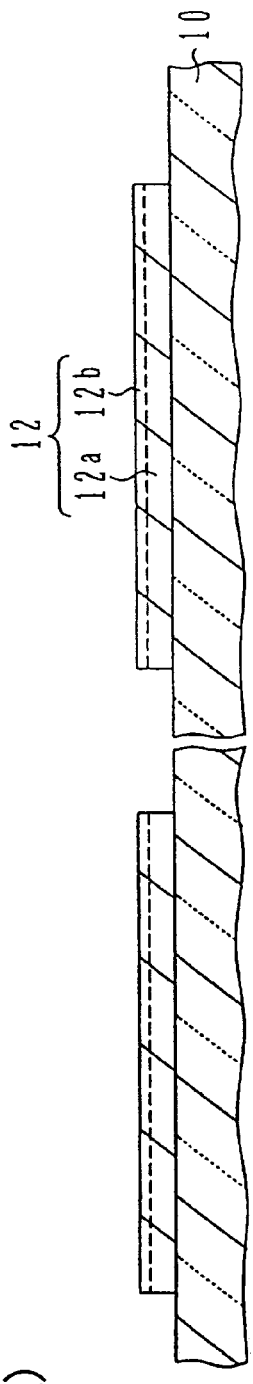
FIGS. 3(A) through 3(F) are cross sectional views illustrating steps for producing the TFT substrate illustrated in FIGS. 1(A) and 1(B) in the order of production.
Figure 3:
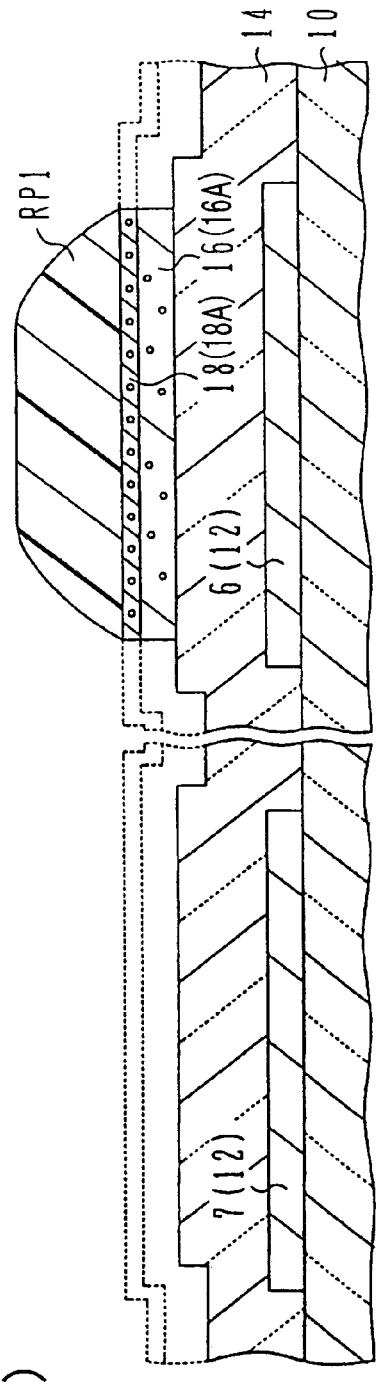
Figure 3:
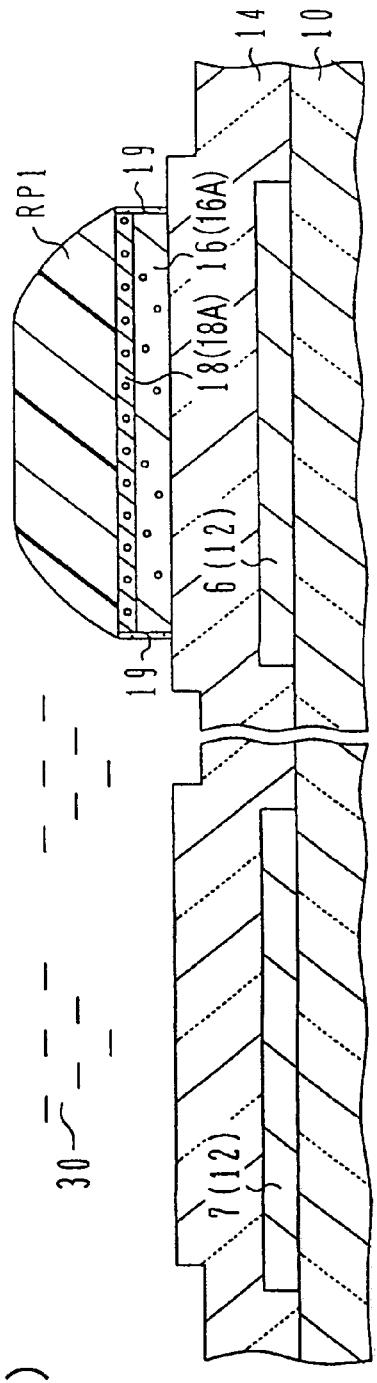
Figure 4:
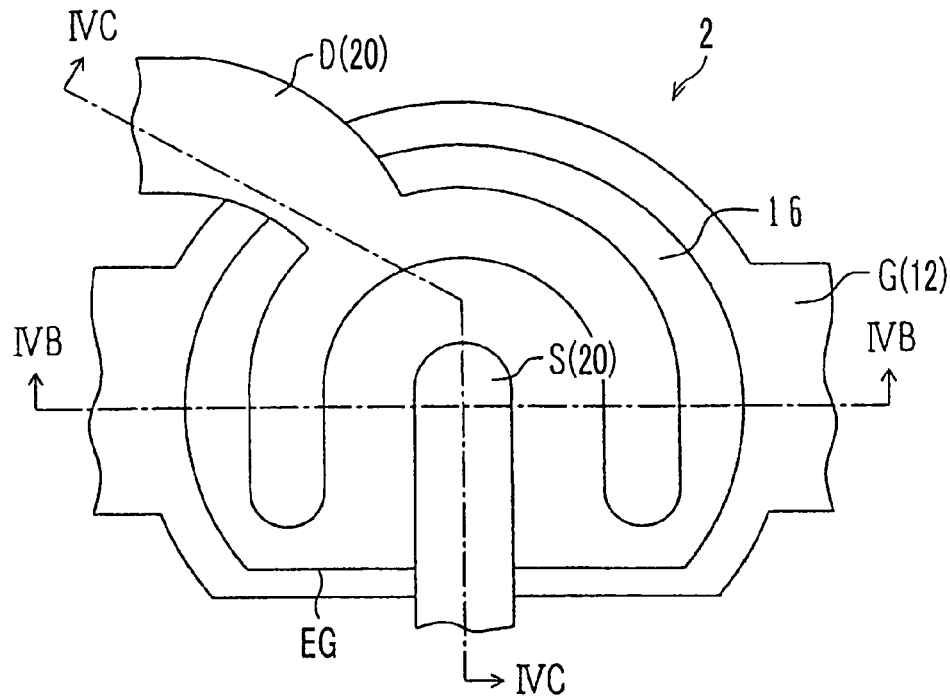
FIG. 4(A) is a plan view schematically illustrating a structure of a studied TFT.
FIG. 4(B) explains studies and analyses carried out by the inventors of the present invention.
FIG. 4(C) explains studies and analyses carried out by the inventors of the present invention.
Figure 4:
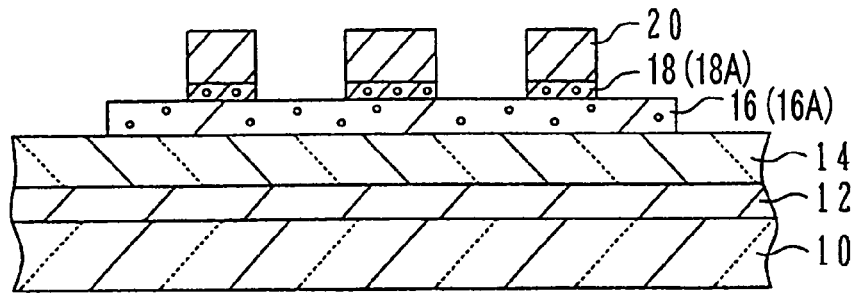
Figure 4:
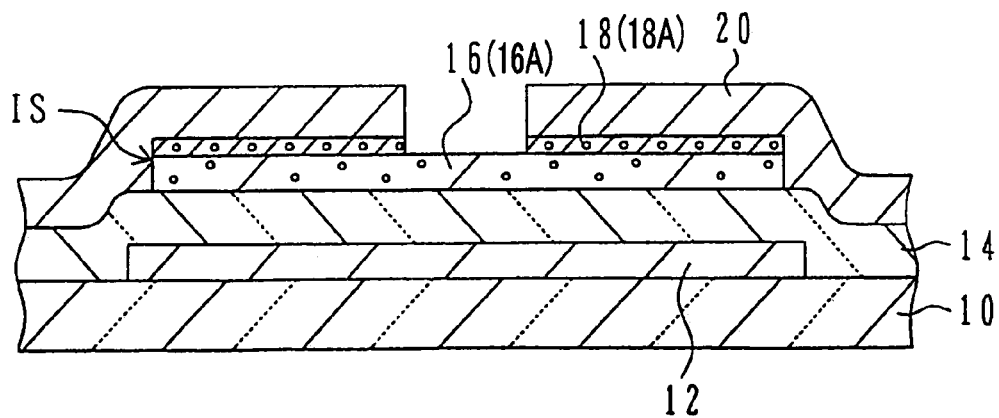
Figure 5:
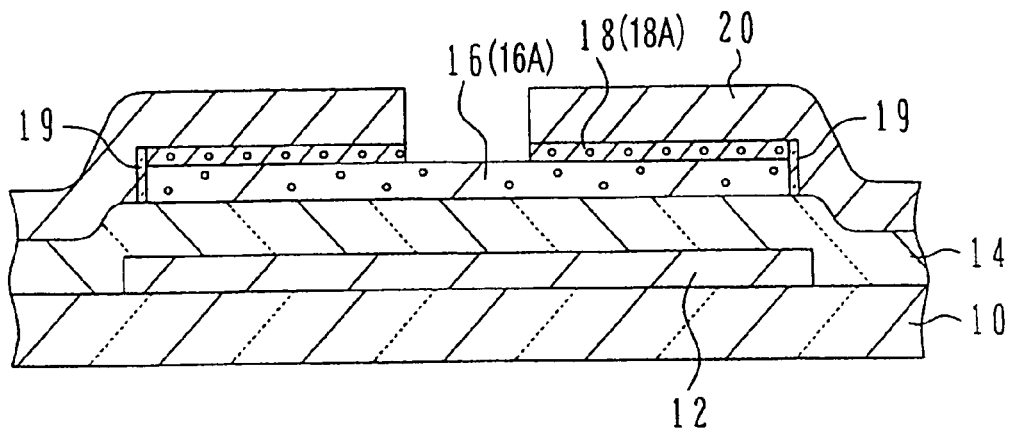
FIG. 5(A) explains further studies and analyses carried out by the inventors of the present invention.
FIG. 5(B) illustrates a cross sectional view taken in IVC-IVC of the TFT illustrated in FIG. 4(A), thereby illustrating steps for producing the TFT illustrated in FIG. 5(A).
FIG. 5(C) illustrates another cross sectional view taken in IVC-IVC of the TFT illustrated in FIG. 4(A), thereby illustrating steps for producing the TFT illustrated in FIG. 5(A).
Figure 5:
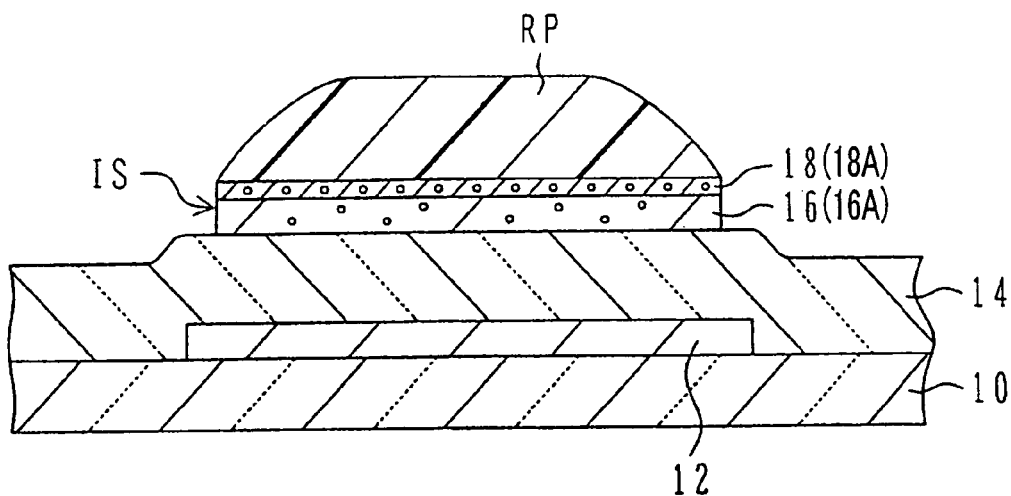
Figure 5:
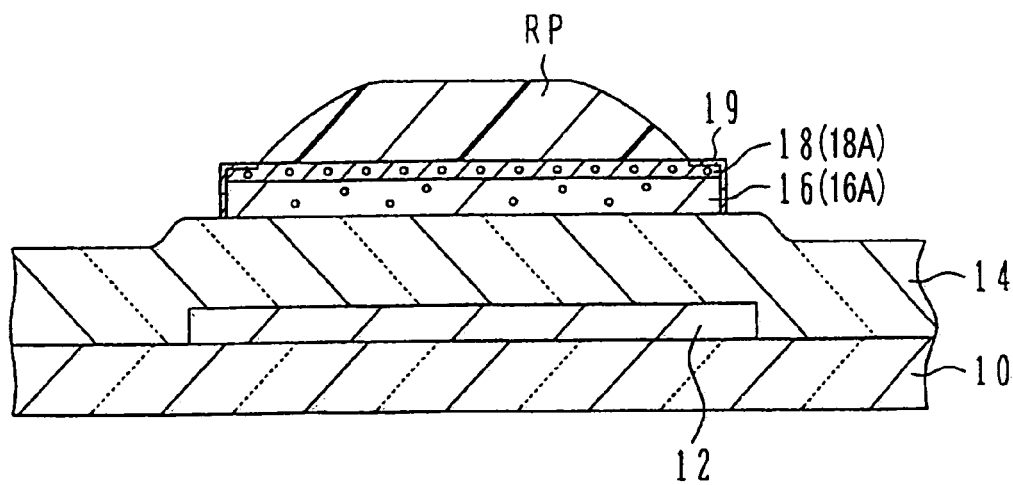

Further, FIG. 4(A) is a plan view schematically illustrating a structure of a studied TFT. FIGS. 4(B) through 5(C) are views explaining studies and analyses carried out by the inventors of the present invention and are cross sectional views schematically illustrating a structure of a TFT in studies carried out in the present invention.

As illustrated in FIG. 2(A), the TFT substrate 1 is arranged so that the gate bus line 6 and the auxiliary capacitor bus line 7 are formed on a glass substrate 10 so as to be parallel to each other. Further, a gate insulating film 14 (not shown in FIG. 2(A). See FIGS. 2(B), 4(B) through 5(C)) is formed on the glass substrate 10 so as to cover the gate bus line 6 and the auxiliary capacitor bus line 7.

Above a gate electrode G provided in the gate bus line 6 extended in a lateral direction (horizontal direction) in FIGS.

2(A) and 4(A), an operating semiconductor layer 16 having an insular shape (insular semiconductor layer) and a low resistance semiconductor layer 18 (see FIGS. 2(B), 4(B) through 5(C)) are laminated in this order, via the gate insulating film 14.

The operating semiconductor layer 16 is an operating layer of the TFT 2 (switching element) in the TFT substrate 1. As illustrated in FIGS. 2(A) and 4(A), the operating semiconductor layer 16 has an insular structure having a substantially semi-circle shape obtained by removing a part of a circle from the circle.

The operating semiconductor layer 16 has a shape whose end, positioned at a side of a pixel region switch-driven by the TFT 2, namely, at a side facing, in a plan view, the pixel electrode 4 (downward direction in FIGS. 2(A) and 4(A)) formed on the pixel region, is notched. As a result, the operating semiconductor layer 16 has a notched end EG parallel to an end of the pixel electrode 4 facing the TFT 2.

The low resistance semiconductor layer 18 is a semiconductor layer used to form an ohmic contact (ohmic contact layer) and is connected with a source electrode S and a drain electrode D of the TFT 2. In the present embodiment, an amorphous silicon layer constituting the operating semiconductor layer 16 is formed on the gate insulating film 14 and an n$^+$ amorphous silicon layer with low resistance used to form the ohmic contact is formed as the low resistance semiconductor layer 18 on the operating semiconductor layer 16.

A wiring layer 20 (electrode/wiring layer) constituting the source electrode S and the drain electrode D is formed on the low resistance semiconductor layer 18.

The n$^+$ amorphous silicon layer constituting the low resistance semiconductor layer 18 is patterned so as to have the same shape as the amorphous silicon layer constituting the operating semiconductor layer 16 and then is patterned so as to have the same shape as the wiring layer 20.

Therefore, an insular region IS, which is made of the insular operating semiconductor layer 16 (insular structure made of the operating semiconductor layer 16 having a shape obtained by removing a part of a circle from the circle), is formed above the gate bus line 6 via the gate insulating film 14. Further, an insular laminated layer (insular layer stack) constituted of the operating semiconductor layer 16 and the low resistance semiconductor layer 18 separated from an outside of the insular region IS by the patterning is formed on the insular region IS.

As illustrated in FIGS. 2(A) and 4(A), the source electrode S extends from a central portion of the insular region IS to the pixel region switch-driven by the TFT 2 through the notched end EG of the insular region IS (operating semiconductor layer 16).

Further, as illustrated in FIG. 2(A), the source electrode S extends downward (toward the pixel electrode 4) from the central portion of the insular region IS and widens its width so as to form a source contact region SC.

An upper electrode UE of the auxiliary capacitor is formed above the auxiliary capacitor bus line 7 so as to be positioned on the gate insulating film 14. In consideration of a defect rate influenced by attachment of foreign substances, it is preferable that the TFT 2, the source contact region SC, and the upper electrode UE are disposed at a central region between two drain bus lines 8.

An end of the drain electrode D is positioned around the source electrode S on the insular region IS so as to have a predetermined interval from the source electrode S, the end of the drain electrode D being positioned so as to surround an end of the source electrode S (an upper end of the source electrode S in FIGS. 2(A) and 4(A)). The drain electrode D, which is formed so as to surround the end of the source electrode S, is drawn out of the insular region IS of the operating semiconductor layer 16 and connected with the drain bus line 8.

A protective insulating film 22 (not shown in FIG. 2(A). See FIG. 2(B)) is formed on the source electrode S and the drain electrode D so as to cover the source electrode S and the drain electrode D. Further, contact holes CH 1 and CH 2 are formed in the protective insulating film 22 so as to be positioned on the source contact region SC and the upper electrode UE of the auxiliary capacitor.

The pixel electrode 4 is formed on the protective insulating film 22 by patterning a transparent electrode layer. The pixel electrode 4 is connected with the source contact region SC and the upper electrode UE of the auxiliary capacitor via the contact holes CH1 and CH2.

Next, before explaining a cross sectional structure of the TFT substrate 1 according to the present embodiment, the following explains studies and analyses that were performed by the inventors of the present invention and solutions found by the inventors of the present invention with reference to FIGS. 4(A) through 4(C).

FIG. 4(B) illustrates a cross sectional view taken in IVB-IVB of the TFT 2 illustrated in FIG. 4(A), thereby schematically illustrating a structure of a TFT in studies carried out in the present invention. FIG. 4(C) illustrates a cross sectional view taken in IVC-IVC of the TFT 2 illustrated in FIG. 4(A), thereby schematically illustrating the structure of the TFT illustrated in FIG. 4(B).

FIG. 4 (A) schematically illustrates a plan structure of the TFT illustrated in FIGS. 4(B) and 4(C) studied in the present invention. However, a cross sectional structure of the TFT 2 according to the present embodiment is a bit different from a cross sectional structure of the TFT in the studies carried out in the present invention.

As illustrated in FIGS. 4(B) and 4(C), a wiring layer 12 (electrode/wiring layer) constituting the gate electrode G is formed on the glass substrate 10. The wiring layer 12 is covered by the gate insulating film 14. The operating semiconductor layer 16 (insular semiconductor layer) of the TFT is formed on the gate insulating film 14 and the low resistance semiconductor layer 18 used to form the ohmic contact is formed on the operating semiconductor layer 16. The wiring layer 20 (electrode/wiring layer) is formed on the low resistance semiconductor layer 18 so as to constitute the source electrode S and the drain electrode D. The low resistance semiconductor layer 18 is patterned so as to have the same shape as the wiring layer 20 (the source electrode S and the drain electrode D) on the insular region IS.

The TFT is formed in such a manner that: (I) the gate electrode G is formed by patterning the wiring layer 12; (II) the gate insulating film 14, an amorphous silicon layer 16A for constituting the operating semiconductor layer 16 (insular semiconductor layer), and a low resistance n$^+$ amorphous silicon layer 18A for constituting the low resistance semiconductor layer 18 are laminated in this order on the gate electrode G; (III) the n$^+$ amorphous silicon layer 18A and the amorphous silicon layer 16A are patterned so that the n$^+$ amorphous silicon layer 18A has the same shape as the amorphous silicon layer 16A; (IV) the wiring layer 20 is deposited; and (V) the wiring layer 20 and the n$^+$ amorphous silicon layer 18A are patterned so that the wiring layer 20 has the same shape as the n$^+$ amorphous silicon layer 18A.

The number of photolithography is only three, which is few. Further, outside the insular region IS (outside the insular laminated layer), the amorphous silicon layer 16A constituting the operating semiconductor layer 16 and the n$^+$ amorphous silicon layer 18A constituting the low resistance semiconductor layer 18 are removed. As a result, it is possible to reduce the amount of wiring in the TFT. In order to divide the n+ amorphous silicon layer 18A constituting the low resistance semiconductor layer 18 into a source electrode S side and a drain electrode D side and to cause the amorphous silicon layer 16A constituting the operating semiconductor layer 16 to have a desired thickness, etching should be performed according to time (controlled etching should be performed).

As a result of studies carried out by the inventors of the present invention, it was found that: in the TFT having the cross sectional structure illustrated in FIGS. 4(B) and 4(C), a leak current flows between the source electrode S and the drain electrode D. The inventors of the present invention inferred that: the leakage is caused because the wiring layer 20 contacts the sidewalls of the operating semiconductor layer 16 and the low resistance semiconductor layer 18 as illustrated in FIG. 4(C), thereby forming Schottky contact. Therefore, the inventors of the present invention considered oxidizing the sidewalls of the operating semiconductor layer 16 and the low resistance semiconductor layer 18 so as to form an oxidized film.

FIG. 5(A) explains further studies carried out by the inventors of the present invention. FIG. 5(A) illustrates a cross sectional view taken in IVC-IVC of the TFT illustrated in FIG. 4(A), thereby schematically illustrating a structure of another TFT in the studies carried out in the present invention.

Compared with the TFT in FIG. 4(C), the TFT in FIG. 5(A) is different form the TFT in FIG. 4(C) in that: in the TFT in FIG. 5(A), an oxidized film 19 (sidewall oxidized film) is formed on the circumferential sidewalls of the operating semiconductor layer 16 and the low resistance semiconductor layer 18 and the sidewalls of the operating semiconductor layer 16 and the low resistance semiconductor layer 18 are electrically separated from the wiring layer 20.

FIGS. 5(B) and 5(C) illustrate steps for producing the TFT in FIG. 5(A) so that the steps are illustrated in the order of the steps by using cross sectional views taken in IVC-IVC of the TFT in FIG. 4(A).

FIG. 5(B) illustrates a step for patterning the amorphous silicon layer 16A constituting the operating semiconductor layer 16 and the n+ amorphous silicon layer 18A constituting the low resistance semiconductor layer 18. In FIG. 5(B), a resist pattern RP having an insular pattern is formed on the n+ amorphous silicon layer 18A and then the amorphous silicon layer 16A and the n+ amorphous silicon layer 18A are etched and patterned by using the resist pattern RP as a mask (mask pattern). When the patterning is finished, the sidewalls of the amorphous silicon layer 16A and the n+ amorphous silicon layer 18A are exposed and the top surface of the n+ amorphous silicon layer 18A is covered by the resist pattern RP. Therefore, the inventors of the present invention deemed that: when exposed surfaces of the amorphous silicon layer 16A and the n+ amorphous silicon layer 18A are oxidized, the structure illustrated in FIG. 5(A) can be obtained.

As such, ashing was performed in oxygen plasma so as to oxidize the sidewalls of the amorphous silicon layer 16A and the n+ amorphous silicon layer 18A. However, the leak current still remains after the ashing.

FIG. 5(C) illustrates a structure of the TFT in a production step of oxidizing, through ashing, the sidewalls of the amorphous silicon layer 16A and the n+ amorphous silicon layer 18A whose top surface is covered by the resist pattern RP. The inventors of the present invention studied this structure.

As illustrated in FIG. 5(C), the sidewalls of the amorphous silicon layer 16A and the n+ amorphous silicon layer 18A are oxidized through ashing, while the resist pattern RP is downsized through ashing. As a result, ends of the resist pattern RP are positioned backward, and accordingly circumferential top surface of the n+ amorphous silicon layer 18A is exposed. The exposed surface of the n+ amorphous silicon layer 18A is oxidized, with a result that not only the sidewall of the n+ amorphous silicon layer 18A but also the circumferential top surface of the n+ amorphous silicon layer 18A is oxidized. As a result, the circumferential portion of the n+ amorphous silicon layer 18A (namely, the circumferential portion of the obtained low resistance semiconductor layer 18) is covered by the oxidized film 19 made of silicon oxide.

When the silicon layer is etched after the wiring layer is etched, the etching rate of the silicon oxide layer is low. Therefore, when the n+ amorphous silicon layer 18A is etched, even though the n+ amorphous silicon layer 18A is completely etched at a region where there is no oxidized film 19 (oxidized silicon film) on the n+ amorphous silicon layer 18A, the n+ amorphous silicon layer 18 is likely to remain unetched at a region covered or having been covered by the oxidized film 19. As described above, the oxidized film 19 is formed in line with the circumference of the low resistance semiconductor layer 18 (the insular semiconductor layer). Therefore, as described above, when the ends of the resist pattern RP are positioned backward and the circumferential top surface of the n+ amorphous silicon layer 18A is oxidized, a leak path is formed in line with the circumference of the obtained low resistance semiconductor layer 18.

Note that by performing over-etching more, it would be possible to completely etch the n+ amorphous silicon layer 18A exposed at the pattern made of the resist pattern RP. However, at that time, a larger amount of the amorphous silicon layer 16A would be etched, with a result that a process margin that allows the amorphous silicon layer 16A to have a desired thickness would be narrower.

Therefore, the inventors of the present invention made further studies based on a result of the foregoing studies and obtained the TFT substrate 1 illustrated in FIG. 2(B). The following explains an example of a cross sectional structure of the TFT substrate 1 according to the present embodiment with reference to FIG. 2(B).

As illustrated in FIG. 2(B), the gate bus line 6 and the auxiliary capacitor bus line 7 are formed on the glass substrate 10. In the present embodiment, each of the gate bus line 6 and the auxiliary capacitor bus line 7 is made of a metal layer made by layering an Al (aluminum) alloy layer and a Ti (titanium) alloy layer. However, the material of the metal layer is not limited to this and known wiring materials are applicable.

Further, a gate insulating film 14 made of a silicon nitride film for example is formed on the glass substrate 10 so as to cover the gate bus line 6 and the auxiliary capacitor bus line 7. The operating semiconductor layer 16 (insular semiconductor layer) of the TFT 2 and the low resistance semiconductor layer 18 (low resistance silicon layer) used to form the ohmic contact are laminated in this order above the gate electrode G in the gate bus line 6.

Further, a first wiring layer 20a made of a metal such as Mo (molybdenum), a second wiring layer 20b made of a metal such as Al, and a third wiring layer 20c made of a metal such as Mo are laminated in this order on the low resistance semiconductor layer 18 and patterned so as to have a wiring shape, thereby forming the wiring layer 20 (electrode/wiring layer).

The wiring layer 20 is etched above the operating semiconductor layer 16 so as to be divided into the source electrode S side and the drain electrode D side. The low resistance semiconductor layer 18 under the wiring layer 20 is also etched so as to be divided into the source electrode S side and the drain electrode D side. The wiring layer 20 extends out of the insular region IS made of the operating semiconductor layer 16 so as to form the source contact region SC. Further, the wiring layer 20 extends above the auxiliary capacitor bus line 7 so as to form the upper electrode UE of the auxiliary capacitor.

The oxidized film 19 (sidewall oxidized film) made of silicon oxide is formed on the circumferential sidewalls of the operating semiconductor layer 16 and the low resistance semiconductor layer 18. Further, at a circumferential portion where the low resistance semiconductor layer 18 has been etched, the oxidized film 19 with a low etching rate remains so as to have a vertical fence-like shape.

However, the oxidized film 19 is not formed on the low-resistance semiconductor layer 18. Therefore, the low-resistance semiconductor layer 18 is etched completely even at a region where the low resistance semiconductor layer 18 contacts the oxidized film 19, with a result that no leak path remains.

Note that the circumferential portion where the low resistance semiconductor layer 18 has been etched is the circumferential portion of the low resistance semiconductor layer 18 facing the peripheral portion of the insular region IS (a region where the operating semiconductor layer 16 is formed) and etched so that the low resistance semiconductor layer 18 has the same shape as the wiring layer 20. To be more specific, the circumferential portion where the low resistance semiconductor layer 18 has been etched corresponds to the circumferential portion of the low resistance semiconductor layer 18 other than a portion below a portion (extending portion) where the wiring layer 20 is drawn out of the insular region IS (the region where the operating semiconductor layer 16 is formed).

Namely, the TFT substrate 1 is arranged so that: (I) the low resistance semiconductor layer 18 is laminated on the insular operating semiconductor layer 16 so as to have the same shape as the wiring layer 20 inside a region where the operating semiconductor layer 16 is formed; (II) the oxidized film 19 made by oxidizing the circumferential sidewalls of the operating semiconductor layer 16 and the low resistance semiconductor layer 18 is formed at a portion of the circumferential sidewalls (circumferential faces) of the operating semiconductor 16 and the low resistance semiconductor 18, the portion being positioned at a portion below a portion (extending portion) where the electrode/wiring layer is drawn out of a region where the operating semiconductor layer is formed; and (III) the oxidized film 19 on the circumferential sidewall of the operating semiconductor layer 16 stands so as to have a fence-like shape (a fence standing higher than the circumferential sidewall of the operating semiconductor layer 16) at a portion other than the portion below the portion where the electrode/wiring layer is drawn, and the oxidized film 19 having the fence-like shape is positioned so as to have an interval from the low resistance semiconductor layer 18.

Further, the protective insulating film 22 such as a silicon nitride layer is formed on the wiring layer 20 so as to cover the wiring layer 20. Further, as described above, the contact holes CH 1 and CH 2 are formed in the protective insulating film 22 so as to be positioned on the source contact region SC and the upper electrode UE of the auxiliary capacitor.

The transparent electrode layer is formed and patterned on the protective insulating film 22 so as to form the pixel electrode 4. The pixel electrode 4 is connected with the source contact region SC and the upper electrode UE of the auxiliary capacitor via the contact holes CH 1 and CH 2.

Next, with reference to FIGS. 3(A) through 3(F), the following explains how to produce a liquid crystal display device having the TFT substrate 1 illustrated in FIGS. 2(A) and 2(B).

First, as illustrated in FIG. 3(A), a protective insulating film (not shown) such as silicon oxide is formed on the glass substrate 10 according to necessity, and then a metal film 12a serving as a main conductive film and a metal film 12b serving as a high melting point metal film are sputtered in this order so as to form a metal film serving as the wiring layer 12. In the present embodiment, as the metal layer (wiring layer 12), an aluminum (including an aluminum alloy) layer whose thickness is 130 nm for example and a titanic (including a titanic alloy) film whose thickness is 70 nm are sputtered in this order so as to form a metal film whose thickness is 200 nm on the whole top surface of the glass substrate 10.

In addition to titanium, examples of the high melting point metal constituting the metal film 12b serving as an upper layer of the wiring layer 20 include chromium (Cr), molybdenum (Mo), tantalum (Ta), and tungsten (W) (alternatively, alloys of these metals). Further, when an aluminum alloy is used for a main conductive film constituting the metal film 12a serving as a lower layer of the wiring layer 20, it is possible to use a material obtained by alloying one or more of neodymium (Nd), silicon (Si), copper (Cu), titanium (Ti), tungsten (W), tantalum (Ta), and scandium (Sc) with aluminum.

Next, a resist layer is applied on the whole top surface of the metal film 12b and is exposed and developed so as to form resist patterns having the shapes of the gate bus line 6 and the auxiliary capacitor bus line 7. Using the resist patterns as an etching mask, dry etching with chlorine gas (gas including chlorine) is performed and then the gate bus line 6 and the auxiliary capacitor bus line 7 are patterned (pattern-formed). Note that connection terminals are formed at ends of the glass substrate 10 at the same time.

Next, as illustrated in FIG. 3(B), the silicon nitride film whose thickness is approximately 400 nm for example is formed on the glass substrate 10 through plasma CVD so as to cover the gate bus line 6 and the auxiliary capacitor bus line 7. The silicon nitride film constitutes the gate insulating film 14. Next, the amorphous silicon layer 16A (high resistance amorphous silicon layer) constituting the operating semiconductor layer 16 is formed on the whole top surface of the gate insulating film 14 through plasma CVD so as to have a thickness of approximately 130 nm. Further, as the low resistance amorphous silicon layer used to form the ohmic contact, for example, the $n^+$ amorphous silicon layer 18A is formed on the amorphous silicon layer 16A through plasma CVD so as to have a thickness of approximately 30 nm.

Next, a photo resist layer is applied onto the whole surface of the gate insulating film 14 through a spin coat process and exposed and developed from the above so as to form a resist pattern RP 1 (first mask pattern) having an insular shape above the gate bus line 6. Using the resist pattern RP 1 as an etching mask, the amorphous silicon layer 16A and the $n^+$ amorphous silicon layer 18A are patterned through dry etching with fluorinated gas (gas including fluorine). As a result, the laminated layer (laminated silicon layer) constituted of the amorphous silicon layer 16A and the $n^+$ amorphous silicon layer 18A remains on a predetermined region above the gate bus line 6 so as to have an insular shape.

Next, as illustrated in FIG. 3(C), ozone water 30 whose ozone density is 3 through 5 ppm is flowed at a flow rate of 10 through 15 liter/min, an ozone water treatment is performed for 30 through 300 seconds at 15 through 40° C. For example, the ozone water treatment is performed for 60 through 180 seconds at a room temperature. As a result, the sidewalls of the amorphous silicon layer 16A and the n⁺ amorphous silicon layer 18A, which sidewalls are exposed out of the resist pattern RP 1, are oxidized. As a result, the oxidized film 19 made of silicon oxide is formed on the sidewalls of the amorphous silicon layer 16A and the n⁺ amorphous silicon layer 18A.

Note that instead of oxidization with ozone water, the oxidized film 19 may be formed on the sidewall of the laminated silicon layer (silicon laminated layer) constituted of the amorphous silicon layer 16A and the n⁺ amorphous silicon layer 18A through oxidization at high pressure in an atmosphere including steam under a condition that temperature is 100 through 250° C., atmosphere pressure is 1.5 through 2.5 MPa (e.g. 2 MPa), and time is 30 through 120 minutes (e.g. 60 minutes).

Because these oxidization methods hardly allows the resist pattern RP 1 to be positioned backward, the sidewall of the laminated silicon layer is oxidized while the top surface of the laminated silicon layer is hardly oxidized. After the oxidizing step, the resist pattern RP 1 is removed by liquid remover.

Next, as illustrated in FIG. 3(D), a metal layer constituting the first wiring layer 20a, a metal layer constituting the second wiring layer 20b, and a metal layer constituting the third wiring layer 20c are laminated in this order on and above the whole top surface of the glass substrate 10 through sputtering so as to cover the amorphous silicon layer 16A and the n⁺ amorphous silicon layer 18A (laminated silicon layer) having been patterned. In the present embodiment, a molybdenum layer whose thickness is 20 nm for example, an aluminum layer whose thickness is 200 nm, and a molybdenum layer whose thickness is 40 nm respectively correspond to the first wiring layer 20a, the second wiring layer 20b, and the third wiring layer 20c, and these layers are laminated through sputtering so as to form the wiring layer 20 whose thickness is 260 nm. In addition to molybdenum (Mo), examples of the metal used for the wiring layer 20 (a high melting point metal) include Cr Ta, W, and the like, as with the gate bus line 6 and the auxiliary capacitor bus line 7.

Next, a photo resist layer is applied onto the whole top surface of the glass substrate 10 on which the metal layers constituting the wiring layer 20 are formed and the photo resist layer is exposed and developed from the above so as to form a resist pattern RP 2 having a wiring (including the source electrode S and the drain electrode D) shape. Using the resist pattern RP 2 as an etching mask, the metal layers constituting the wiring layer 20 are etched through wet etching with a mixture of acetic acid, nitric acid, and phosphoric acid, with a result that the wiring layer 20 including the source electrode S, the drain electrode D, the source contact region SC, and the like is patterned (pattern-formed).

Next, using the same resist pattern RP 2 as an etching mask, the n⁺ amorphous silicon layer 18A is etched through dry etching with fluorinated gas so as to have the same shape as the wiring layer 20.

Note that: when over-etching is performed so as to completely etch the n⁺ amorphous silicon layer 18A (low resistance semiconductor layer 18) exposed at the resist pattern RP 2, the amorphous silicon layer 16A with high resistance constituting the operating semiconductor layer 16 is slightly etched.

Because the oxidized film 19 is not formed on the top surface of the n⁺ amorphous silicon layer 18A (low resistance semiconductor layer 18) but formed so as to have a fence-like shape being vertical to a normal line of the TFT substrate 1 (namely, a normal line of the glass substrate 10), the oxidized film 19 does not prevent the etching. Further, with the etching, the n⁺ amorphous silicon layer 18A (low resistance semiconductor layer 18) contacting the oxidized film 19 is etched.

As a result, it is possible to completely etch the n⁺ amorphous silicon layer 18A (the low resistance semiconductor layer 18) exposed at the resist pattern RP 2. After the etching step, the resist pattern RP 2 is removed by the liquid remover.

FIG. 3(E) is a cross sectional view schematically illustrating a structure of the TFT substrate 1 in a state where the etching has been finished and the resist pattern RP 2 has been removed. Though the oxidized film 19 illustrated at a right portion of FIG. 3(E) remains so as to have the fence-like shape, there is no low resistance semiconductor layer 18 on the sidewall of the oxidized layer 19. Therefore, the leak path is not formed.

Next, as illustrated in FIG. 3(F), a silicon nitride layer serving as the protective insulating layer 22 whose thickness is approximately 300 nm is formed on the whole top surface of the glass substrate 10 on which the wiring layer 20 has been patterned (pattern-formed) through plasma CVD so as to cover the wiring layer 20 having been patterned. Next, a resist pattern is formed on the silicon nitride layer so as to form the contact holes CH 1 and CH 2 (see FIGS. 2(A) and 2(B)) on the source contact region SC and the upper electrode UE of the auxiliary capacitor, respectively.

Thereafter, an indium tin oxide (ITO) film is formed as the transparent electrode in an amorphous phase through sputtering and the like so as to have a thickness of approximately 70 nm. Next, a resist pattern is formed on the ITO film and the transparent electrode (ITO film) is patterned (pattern-formed) through wet etching with oxalic acid etchant. The transparent electrode (ITO film) is electrically connected with the source contact region SC and the upper electrode UE of the auxiliary capacitor via the contact holes CH 1 and CH 2, respectively. Thereafter, the transparent electrode (ITO film) is crystallized through thermal treatment at a temperature of 150 through 230° C. (e.g. 200° C.), with a result that the pixel electrode 4 electrically connected with the source contact region SC and the upper electrode UE of the auxiliary capacitor is formed.

Thereafter, according to necessity, an orientation film (not shown) is formed on the whole face of the obtained TFT substrate 1 so as to face the counter substrate 3 (see FIG. 1(A)).

The liquid crystal display device according to the present embodiment can be formed by combining the TFT substrate 1 (active matrix substrate) with the counter substrate 3 so as to have a liquid crystal layer between the TFT substrate 1 and the counter substrate 3. The liquid crystal layer can be easily formed in such a manner that: the TFT substrate 1 (active matrix substrate) and the counter substrate 3 are combined with each other via a sealing material so as to remain a liquid crystal port, liquid crystal is poured from the liquid crystal port to a space between the TFT substrate 1 and the counter substrate 3, and the liquid crystal port is sealed. Polarizing plates P1 and P2, which constitute a pair, are disposed outside the TFT substrate 1 and the counter substrate 3 according to necessity.

An example of the counter substrate 3 is a color filter substrate. A method for forming the counter substrate 3 such as the color filter substrate is not particularly limited. The counter substrate 3 may be formed through a known method. Further, a structure of the counter substrate 3 is not particularly limited. Besides, various known techniques disclosed in embodiments of Documents 3 and 4 can be used in the structure of the liquid crystal display device and in the method for producing the liquid crystal display device.

As described above, it is important that the mask pattern (first mask pattern) used in oxidizing the sidewall of the laminated silicon layer constituted of the amorphous silicon layer 16A and the n⁺ amorphous silicon layer 18A is not positioned behind the sidewall (circumferential sidewall) of the laminated silicon layer while the sidewall is oxidized.

In other words, it is important that: when the circumferential sidewall of the laminated silicon layer is oxidized, the peripheral portion of the mask pattern (first mask pattern) is not positioned more inward than (is prevented from being behind) (does not contract from) the peripheral portion of the oxidized film 19 (sidewall oxidized film) formed on the circumferential sidewall of the laminated silicon layer (namely, the circumferential sidewall of the laminated silicon layer). It is important that: the oxidization is performed under a condition that the mask pattern is not positioned behind (at least, ends of a face (peripheral portion) of the mask pattern contacting the low resistance semiconductor layer 18 are not positioned more inward than (do not contract from) ends of a face (peripheral portion) of the low resistance semiconductor layer 18 contacting the mask pattern).

In order to oxidize the circumferential sidewall of the laminated silicon layer whose top surface is covered by the mask pattern under a condition that the peripheral portion of the mask pattern is not positioned more inward than the circumferential sidewall of the laminated silicon layer, selection should be suitably performed as to what kind of mask pattern is to be used or what kind of oxidizing method is to be used or as to what mask pattern and what oxidizing method are to be combined with each other. For example, a known oxidizing method is selected and a mask pattern which is resistant to contraction under an oxidizing condition of the oxidizing method (e.g. heat resistance and chemical resistance) is used. Alternatively, the most suitable oxidizing method (oxidizing condition) is selected and determined out of known oxidizing methods so as to be in accordance with material properties of a mask pattern to be used.

When a resist pattern is used as the mask pattern (first mask pattern) such as the resist pattern RP 1, it is preferable that oxidization with ozone water or oxidization at high pressure is performed as described in the example.

Figure 6:
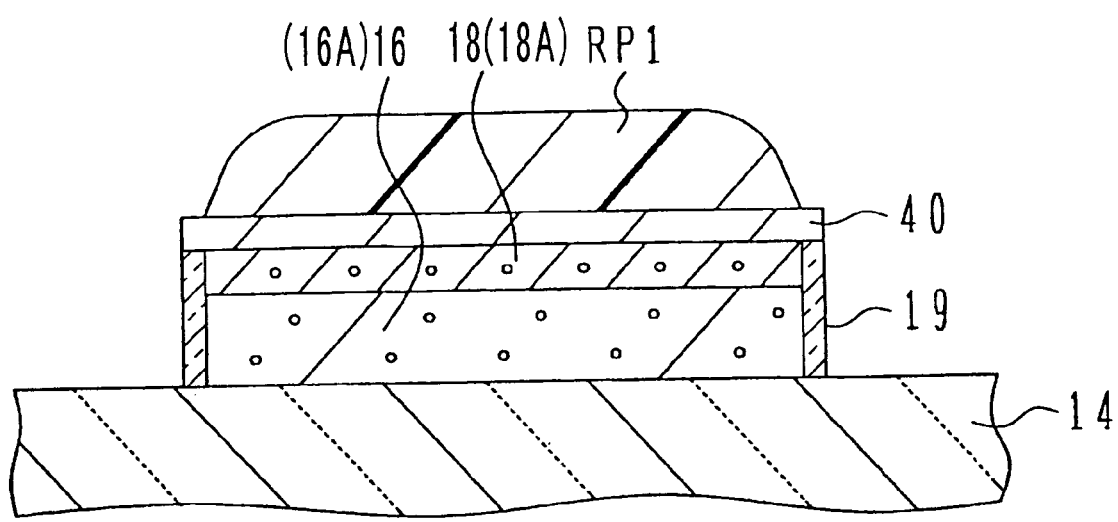
FIG. 6 is a cross sectional view illustrating a variation of the method for producing the liquid crystal display device according to the embodiment of the present invention.

Further, the present invention may be arranged so that: as illustrated in FIG. 6, a mask layer 40 (mask pattern) such as a TIN film is further formed below the resist pattern RP 1. Namely, the first mask pattern used in the present embodiment may have a lamination structure having at least two layers. For example, the first mask pattern may be a mask pattern (laminated mask pattern) made by layering a mask pattern made of a resist material and a mask pattern made of a material other than the resist material (e.g. a metal material as described above).

The mask layer 40 can be formed in such a manner that: a metal film made of a metal material such as TIN used to form the mask layer 40 is laminated on the laminated silicon layer, the resist pattern RP 1 for example is formed on the metal film so as to be an insular mask pattern (third mask pattern), and the metal film is patterned by using the insular third mask pattern as an etching mask.

Then, the etching is continued by using the third mask pattern as the etching mask, so that it is possible to pattern the laminated silicon layer by using, as an etching mask (first mask pattern), a laminated mask pattern made by forming the resist pattern RP 1 (third mask pattern) on the mask layer 40 (fourth mask pattern).

The mask layer 40 such as a TIN film is not positioned behind the sidewall of the laminated silicon layer in the oxidizing step.

Therefore, with the arrangement (e.g. an arrangement illustrated in FIG. 6), even when the resist pattern RP 1 is positioned behind the sidewall of the laminated silicon layer in the oxidization step, the surface (top surface, namely, a face contacting the first mask pattern) of the n⁺ amorphous silicon layer 18A (low resistance semiconductor layer 18) is still covered by the mask layer 40.

Therefore, it is easier to oxidize the sidewall of the n⁺ amorphous silicon layer 18A without oxidizing the top surface of the n⁺ amorphous silicon layer 18A (top surface of the laminated silicon layer). As a result, it is easier to remove the n⁺ amorphous silicon layer 18A (low resistance semiconductor layer 18) so that the n⁺ amorphous silicon layer 18A has the same shape as the wiring layer 20.

It is preferable that the mask layer 40 is selectively removed at the same time with the removal of the resist pattern RP 1 or after the removal of the resist pattern RP 1.

Further, in the method for producing the active matrix substrate illustrated in FIG. 6, the case where the laminated silicon layer is oxidized while the resist pattern RP 1 is laminated on the mask layer 40 is explained as an example. However, the present invention is not limited to this case. The present invention may be arranged so that: the resist pattern RP 1 is removed before the step of oxidizing the laminated silicon layer and then the laminated silicon layer is oxidized by using the mask layer 40 as the etching mask (first mask pattern).

As described above, with the method according to the present invention for producing the TFT substrate 1 (active matrix substrate) and the method according to the present invention for producing the liquid crystal substrate including the TFT substrate 1 (active matrix substrate), it is possible to perform the oxidization while the top surface of the n⁺ amorphous silicon layer 18A (low resistance semiconductor layer 18) (namely, the top surface of the laminated silicon layer) is (completely) covered by the first mask pattern.

Namely, with the present embodiment, it is possible to perform the oxidization while ends of the first mask pattern and ends of the n⁺ amorphous silicon layer 18A (low resistance semiconductor layer 18) are (completely) superimposed.

As a result, in a step for removing the n⁺ amorphous silicon layer 18A (low resistance semiconductor layer 18) so that the n⁺ amorphous silicon layer 18A has the same shape as the wiring layer 20 (step for patterning the wiring layer 20), it is possible to completely remove the n⁺ amorphous silicon layer 18A (low resistance semiconductor layer 18) exposed at the mask pattern used in the step (namely, the second mask pattern used to pattern the wiring layer 20 and the low resistance semiconductor layer 18) so that a leak path does not remain.

As a result, with the present embodiment, it is possible to provide (i) an active matrix substrate and a liquid crystal display device in which leakage in a produced TFT is small and a process margin is large and (ii) methods for producing the active matrix substrate and the liquid crystal display device.

In the present embodiment, the case where the active matrix substrate is the TFT substrate 1 whose switching element is the TFT 2 is explained. However, the present invention is not limited to this case as long as the present invention has a laminated layer (laminate, laminated structure) including the operating semiconductor layer 16 and a low resistance semiconductor layer for a contact.

Further, in the present embodiment, the case where an electronic device such as a display device including the active matrix substrate is a liquid crystal display device is explained. However, the present invention is not limited to this case. The electronic device may be a display device using a display medium other than liquid crystal (e.g. dielectric medium). For example, the electronic device may be a known electronic device other than a display device, which uses an active matrix substrate (e.g. an image scanner, a two-dimensional image detection apparatus such as an X ray image detection apparatus).

Further, in the present embodiment, the case where the liquid crystal display device is a transmissive liquid crystal display device is explained. However, the present invention is not limited to this case. The liquid crystal display device may be a reflective liquid crystal display device or a semi-transmissive liquid crystal display device.

The present embodiment explains, as an example, the case where a transparent substrate having an insulating property (an insulating transparent substrate, specifically, the glass substrate 10) is used as a base substrate of the active matrix substrate. However, the present invention is not limited to this case, and the base substrate may be a semitransparent substrate or untransparent substrate. However, when the active matrix substrate is used as a substrate at a display side or a light-emitting side, a substrate having translucency (preferably, a transparent substrate) is used as the base substrate.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A method for producing an active matrix substrate, said method comprising the steps of:
   (a) forming, above an insulating substrate, a layer stack which includes an operating semiconductor layer and a low resistance semiconductor layer;
   (b) forming a first mask pattern having an insular shape on the layer stack, the first mask pattern being a resist pattern;
   (c) patterning the layer stack so that the layer stack becomes insular by using the first mask pattern as an etching mask;
   (d) oxidizing a circumferential sidewall of the layer stack whose top surface is covered by the first mask pattern, under a condition that at least an end of the first mask pattern which end contacts the low resistance semiconductor layer is not positioned more inward than an end of the layer stack which end contacts the first mask pattern so as to form a sidewall oxidized film only on the circumferential sidewall of the layer stack;
   (e) removing the first mask pattern so as to form an insular layer stack in which the sidewall oxidized film is formed only on the circumferential sidewall of the layer stack;
   (f) forming an electrode/wiring layer on the layer stack so as to cover the layer stack, wherein the electrode/wiring layer is patterned so that a drain electrode is formed so as to surround an end of a source electrode;
   (g) forming a second mask pattern having a wiring shape on the electrode/wiring layer;
   (h) patterning the electrode/wiring layer by using the second mask pattern as an etching mask;
   (i) patterning a whole thickness of the low resistance semiconductor layer and a partial thickness of the operating semiconductor layer by using the second mask pattern as an etching mask so that the electrode/wiring layer in a region where the insular operating semiconductor layer is formed has a same shape as the low resistance semiconductor layer; and
   (j) removing the second mask pattern so as to leave the low resistance semiconductor layer which has been divided on the operating semiconductor layer and the electrode/wring layer which has been electrically connected with the low resistance semiconductor layer; wherein
   in step (d), the sidewall oxidized film is formed only on the circumferential sidewall of the layer stack by oxidizing the circumferential sidewall of the layer stack whose top surface is covered by the first mask pattern through oxidization with ozone water or oxidization at high pressure under a condition where the end of the first mask pattern is not positioned more inward than an end of the low resistance semiconductor layer.

2. The method as set forth in claim 1, wherein the step (d) is performed with ozone water whose ozone density is 3 through 5 ppm.

3. The method as set forth in claim 1, wherein the step (d) is performed through oxidization at high pressure under a condition that: an atmosphere includes steam, temperature is 100 through 250° C., and atmosphere pressure is 1.5 through 2.5 MPa.

4. The method as set forth in claim 1, wherein the step (b) includes a step (b1) of overlaying the layer stack with a metal film, a step (b2) of forming a third mask pattern having an insular shape on the metal film, and a step (b3) of patterning the metal film by using the third mask pattern having the insular shape as an etching mask so as to form an insular first mask pattern including the metal film.

5. An active matrix substrate produced through the method as set forth in claim 1, wherein
   the low resistance semiconductor layer, which has a same shape as the electrode/wiring layer in the region where the insular operating semiconductor layer is formed, is laminated on the insular operating semiconductor layer,
   the sidewall oxidized film is formed on (I) a circumferential sidewall of the operating semiconductor layer and (II) a portion of a circumferential sidewall of the low resistance semiconductor layer, said portion being positioned below a portion where the electrode/wiring layer is drawn out of a region where the operating semiconductor layer is formed, and
   the sidewall oxidized film on the circumferential sidewall of the operating semiconductor layer, which sidewall oxidized film being on a portion other than the portion below the portion where the electrode/wiring layer is drawn in the layer stack, stands so as to have a fence-like shape, the sidewall oxidized film having the fence-like shape being positioned so as to have an interval from the low resistance semiconductor layer.

6. A liquid crystal display device, comprising the active matrix substrate as set forth in claim 5.

7. An electronic device, comprising the active matrix substrate as set forth in claim 5.

8. A method for producing a liquid crystal display device, said method comprising the step of combining an active matrix substrate produced through the method as set forth in claim 1 with a counter substrate so that the active matrix substrate and the counter substrate have a liquid crystal layer therebetween.

9. A method for producing a liquid crystal display device, said method comprising the steps of:
   (a) forming, above an insulating transparent substrate, a layer stack which includes an operating semiconductor layer and a low resistance semiconductor layer for a contact;
   (b) forming a first mask pattern having an insular shape on the layer stack, the first mask pattern being a resist pattern;

(c) patterning the layer stack so that the layer stack becomes insular by using the first mask pattern as an etching mask;

(d) oxidizing a circumferential sidewall of the layer stack, which sidewall is exposed at the first mask pattern, so as to form a sidewall-oxidized film without allowing the first mask pattern to be positioned behind the sidewall oxidized film;

(e) removing the first mask pattern so as to expose an insular layer stack in which the sidewall oxidized film is formed only on the circumferential sidewall;

(f) depositing, after the step (e), an electrode/wiring layer so as to cover the insular layer stack;

(g) forming a second mask pattern having a wiring shape on the electrode/wiring layer; and (h) patterning the electrode/wiring layer by using the second mask pattern as an etching mask so that a drain electrode is formed so as to surround an end of a source electrode; wherein in step (d), the sidewall oxidized film is formed only on the circumferential sidewall of the layer stack by oxidizing the circumferential sidewall of the layer stack whose top surface is covered by the first mask pattern through oxidization with ozone water or oxidization at high pressure under a condition where the end of the first mask pattern is not positioned more inward than an end of the low resistance semiconductor layer.

10. The method as set forth in claim 9, further comprising the steps of:

(i) patterning a whole thickness of the low resistance semiconductor layer and a part of a thickness of the operating semiconductor layer by using the second mask pattern as an etching mask; and (j) removing the second mask pattern so as to leave the low resistance semiconductor layer which has been divided on the operating semiconductor layer and the electrode/wring layer which has been electrically connected with the low resistance semiconductor layer.

11. The method as set forth in claim 10, wherein the step (i) is performed through dry etching.

12. The method as set forth in claim 10, wherein: in the step (i), the low resistance semiconductor layer is completely removed from a region outside the second mask pattern, said region including a region contacting the sidewall oxidized film.

13. The method as set forth in claim 10, further comprising the steps of:

(k) forming, after the step (i), an insulating protective film so as to cover the electrode/wiring layer;

(l) forming a contact hole in the insulating protective film so that the contact hole is positioned on a predetermined region of the electrode/wiring layer; and (m) forming a transparent electrode layer on the insulating protective layer and patterning the transparent electrode layer so that the transparent electrode layer has a pixel electrode shape.

14. The method as set forth in claim 9, further comprising the steps of:

(x) forming, before the step (a), a gate bus line and an auxiliary capacitor bus line on the insulating transparent substrate; and (y) forming a gate insulating layer so as to cover the gate bus line and the auxiliary capacitor bus line.

15. The method as set forth in claim 9, wherein the second mask pattern is a resist pattern.

16. The method as set forth in claim 9, wherein the step (d) is performed with ozone water whose ozone density is 3 through 5 ppm.

17. The method as set forth in claim 9, wherein the step (d) is performed through oxidization at high pressure in an atmosphere including steam under a condition that temperature is 100 through 250° C. and atmosphere pressure is 1.5 through 2.5 MPa.

* * * * *